US007505301B2

(12) United States Patent
Park

(10) Patent No.: US 7,505,301 B2
(45) Date of Patent: Mar. 17, 2009

(54) APPARATUS AND METHOD OF DRIVING MEMORY FOR DISPLAY DEVICE

(75) Inventor: Jong Hoon Park, Anyang-si (KR)

(73) Assignee: Msyslab Co., Ltd. (KR)

( * ) Notice: Subject to any disclaimer, the term of this patent is extended or adjusted under 35 U.S.C. 154(b) by 904 days.

(21) Appl. No.: 10/960,859

(22) Filed: Oct. 7, 2004

(65) Prior Publication Data

US 2006/0017719 A1 Jan. 26, 2006

(30) Foreign Application Priority Data

Jul. 22, 2004 (KR) ..................... 10-2004-0057343

(51) Int. Cl.
*G11C 11/24* (2006.01)

(52) U.S. Cl. ...................... 365/149; 365/222; 345/534; 345/572

(58) Field of Classification Search ................. 365/149, 365/222; 345/98, 99, 572, 574, 534
See application file for complete search history.

(56) References Cited

U.S. PATENT DOCUMENTS

| | | | | |
|---|---|---|---|---|
| 5,701,270 | A | 12/1997 | Mohan Rao | 365/230.03 |
| 5,835,965 | A | 11/1998 | Taylor et al. | 711/211 |
| 5,945,972 | A * | 8/1999 | Okumura et al. | 345/98 |
| 6,040,826 | A | 3/2000 | Furukawa | 345/196 |
| 6,128,025 | A | 10/2000 | Bright et al. | 345/504 |
| 6,246,386 | B1 | 6/2001 | Perner | 345/90 |
| 6,633,273 | B2 * | 10/2003 | Ikeda et al. | 345/99 |
| 6,750,838 | B1 | 6/2004 | Hirakata | 345/98 |
| 6,801,213 | B2 | 10/2004 | Bergstrom et al. | 345/596 |
| 6,876,365 | B1 | 4/2005 | Tsutsui et al. | 345/536 |
| 6,903,990 | B2 | 6/2005 | Mizugaki | 365/222 |
| 6,920,077 | B2 | 7/2005 | Puar et al. | 365/226 |
| 6,933,915 | B2 * | 8/2005 | Hidaka et al. | 345/98 |
| 6,965,365 | B2 * | 11/2005 | Nakamura | 345/87 |
| 7,012,849 | B2 * | 3/2006 | Otose | 365/189.15 |
| 7,180,495 | B1 * | 2/2007 | Matsueda | 345/98 |

FOREIGN PATENT DOCUMENTS

JP 9-180437 7/1997

OTHER PUBLICATIONS

WO01/29814, Apr. 26, 2001, Matsueda.*

* cited by examiner

*Primary Examiner*—Van Thu Nguyen
*Assistant Examiner*—Alexander Sofocleous
(74) *Attorney, Agent, or Firm*—Cantor Colburn LLP

(57) ABSTRACT

A display driver having Dynamic Random Access Memory (DRAM) cells and a method of controlling the timing of the display driver are disclosed. The display driver includes memory cells each of which is implemented using a DRAM cell having a single transistor and a single capacitor. The display driver includes a drive control unit generating a scan signal, a refresh signal and a write/read signal, a word line drive unit driving word lines of the memory cells, and a data input/output unit for controlling input/output of data to/from the memory cells. The display driver gives priority to a write/read operation over a refresh operation and a scan operation.

13 Claims, 5 Drawing Sheets

APPARATUS AND METHOD OF DRIVING MEMORY FOR DISPLAY DEVICE

BACKGROUND OF THE INVENTION

1. Field of the Invention

The present invention relates to a system for driving display devices and, more particularly, to a device for driving memory in a display device and a method of controlling driving operations.

2. Description of the Related Art

Recently, a demand for mobile equipments, such as mobile phones and Personal Digital Assistants (PDAs), is greatly increased. Accordingly, there has been an increased demand on display devices for the mobile equipments. The display devices have a display driver for driving a display panel including Thin Film Transistors (TFTs). Generally, the display driver has memory cells for storing data, and the data stored in the memory cells is output to the display panel with a regular interval. In order to properly drive a display driver, a collision between a data read/write operation and a scan operation must be prevented. Here, the data read/write operation is performed by reading/writing data from/into the memory cells, and the scan operation is performed by transmitting the data of the memory cells to a display panel.

FIG. 1 is a view showing a memory cell of a conventional display driver. The memory cell of FIG. 1 has a dual port structure in which a write processing block 101 and a scan processing block 103 are separated from each other. The write processing block 101 includes two transistors MN11 and MN12 for transmitting data of a pair of bit lines BL and BLB in response to a word line drive signal WLD, and four transistors MP11, MN13, MP12 and MN14 for latching transmitted input data. The scan processing block 103 includes two transistors MN15 and MN16 for scanning latched data in response to a scan signal SA. That is, in the memory cell of FIG. 1, a circuit in which an operation of writing/reading data to/from memory cells is performed, and a circuit in which a scan operation of outputting the data of the memory cells to a display panel is performed, are separated from each other. Accordingly, a data collision between the two operations is prevented.

However, the conventional display drivers have drawbacks in that the memory cell of a conventional display driver is composed of eight transistors as shown in FIG. 1. As a result, the conventional display drivers necessitate a large layout area.

SUMMARY OF THE INVENTION

Accordingly, the present invention has been made keeping in mind the above problems occurring in the prior art, and an object of the present invention is to provide a display driver in which a unit memory cell is implemented using a Dynamic Random Access Memory (DRAM) cell composed of a single transistor and a single capacitor, and a method of controlling the timing of the same.

In an embodiment, the display driver of the present invention includes a memory array having memory cells arranged in a matrix form defined by rows and columns, each of the memory cells being a DRAM cell in which a refresh operation is performed at a regular refresh period to validly maintain stored data, and a drive control unit for generating a scan signal, a refresh signal and a write/read signal to control a scan operation of scanning data from the memory array and transmitting the scanned data to a display panel in response to activation of the scan signal, a refresh operation of refreshing the memory array in response to activation of the refresh signal, and a write/read operation of writing/reading the data of an external system to/from the memory cells, respectively. The scan and refresh operations are stopped while the write/read operation is performed. The display driver also includes a word line drive unit for providing a word line drive signal for activating the word line of each of the memory cells in response to the activation of one of the scan signal, the refresh signal and the write/read signal, and a data input/output unit for controlling the input/output of data to/from the memory cells of the memory array, amplifying the data of the bit line of each of the memory cells, forming a transmission path toward the external system during the write/read operation, and forming a transmission path toward the display panel during the scan operation.

In another embodiment of the present invention, a method of controlling the timing of a display driver includes the steps of performing a scan operation of scanning data from the memory array and transmitting the scanned data to a display panel, and performing a refresh operation of refreshing the memory array. The scan operation is performed in response to the first direction transition edge of a clock signal, and the refresh operation is performed in response to the second direction transition edge of the clock signal, in order to prevent the scan and refresh operations from being simultaneously performed.

In another aspect of the present invention, a write/read operation is given priority over scan and refresh operations when the scan operation of scanning data from the memory array and transmitting the scanned data to the display panel, the refresh operation of refreshing the memory array, and the write/read operation of writing/reading data to/from the memory cells are simultaneously requested to be performed. The scan and refresh operations are stopped while the write/read operation is performed.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
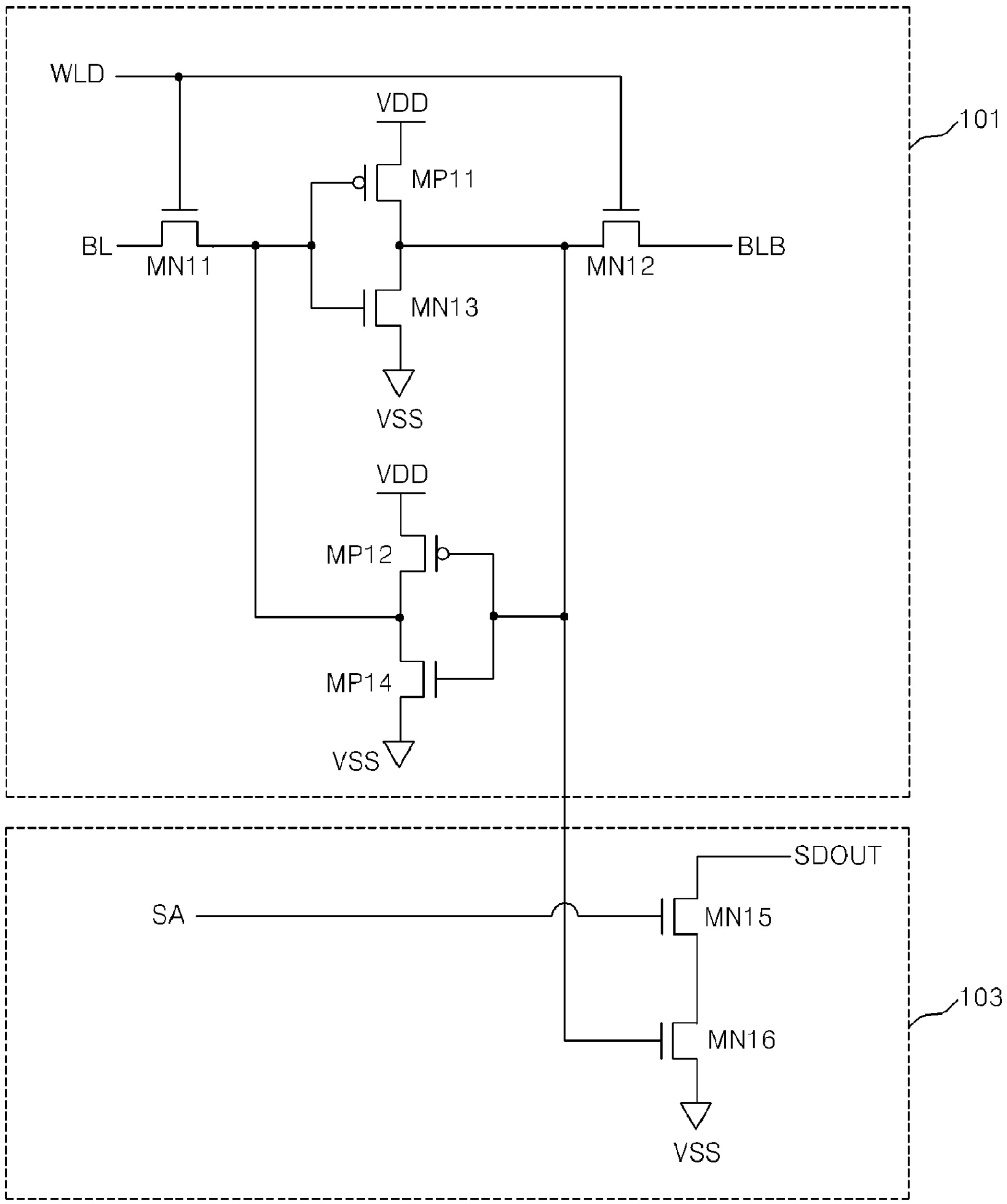
FIG. 1 (Prior Art)
FIG. 1 is a view showing a memory cell of a conventional display driver.

In order to fully understand the present invention, the operational advantages of the present invention and objects accomplished by the practice of the present invention, reference should be made to the attached drawings and the contents of the drawings illustrating preferred embodiments of the present invention. In the drawings, the same reference numerals are used throughout the different drawings to designate the same components. Additionally, detailed descriptions of well-known functions and constructions, which may make the gist of the present invention unclear, are omitted.

A display driver and a method of controlling the timing of the display driver in accordance with the present invention are described in detail with reference to the attached drawings below.

Figure 2:
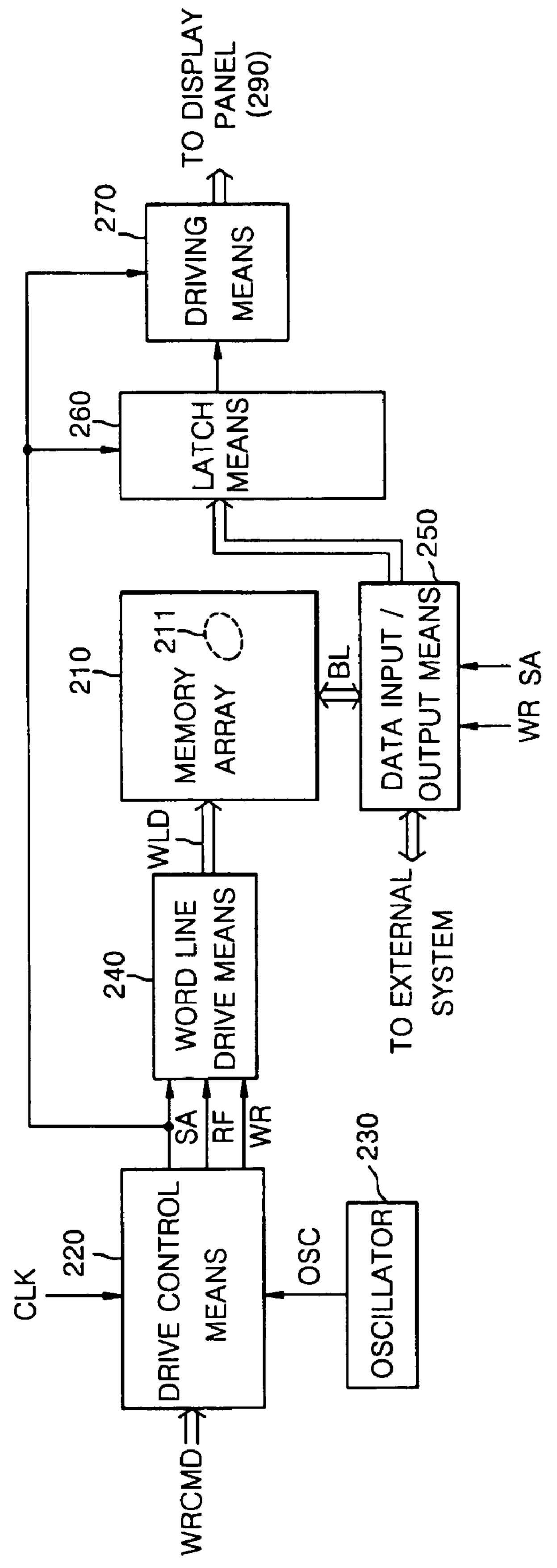
FIG. 2 is a view showing a display driver according to an embodiment of the present invention.

FIG. 2 is a view showing a display driver according to an embodiment of the present invention. The display driver in this embodiment includes a memory array 210 having a plurality of memory cells 211 arranged in a matrix form defined by rows and columns, a drive control unit 220, a word line drive unit 240 and a data input/output unit 250. The display driver further includes an oscillator 230, a latch unit 260 and a driving unit 270.

Figure 3:
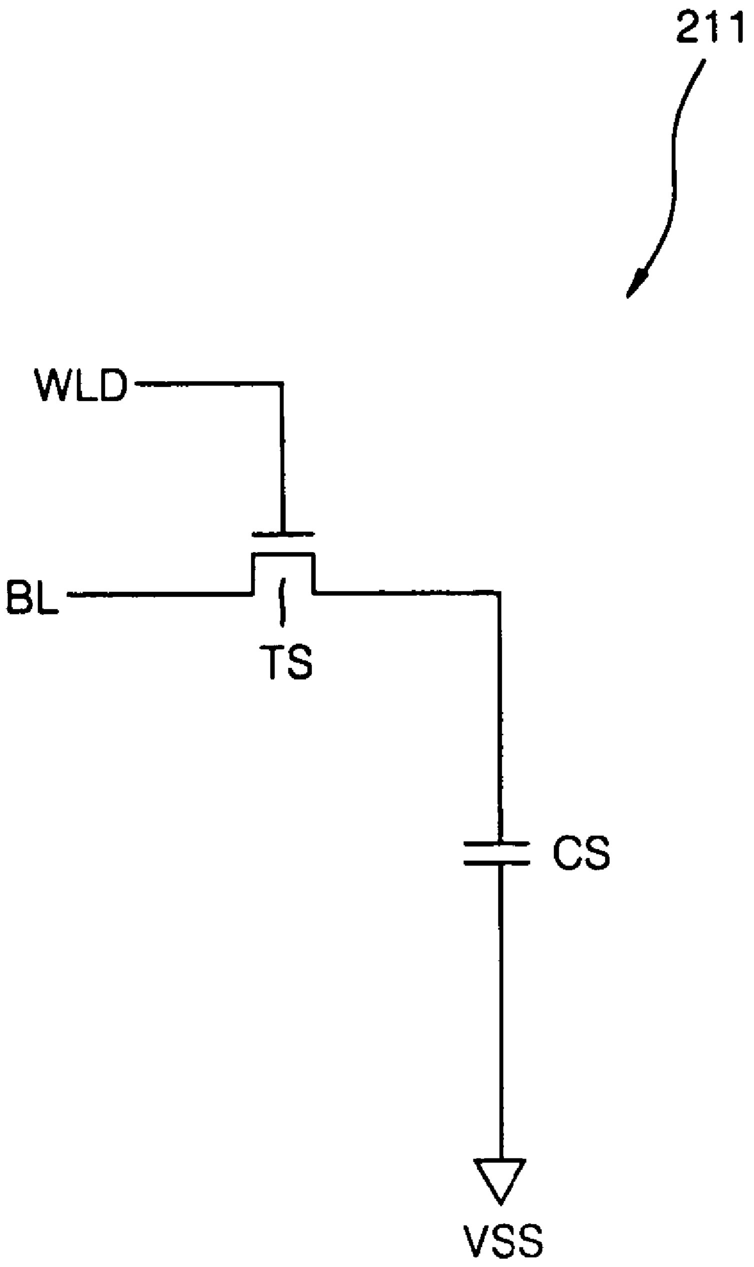
FIG. 3 is a view showing a memory cell of the display driver in FIG. 2.

Each of the memory cells 211 included in the memory array 210 is implemented with, for example, a DRAM cell as shown in FIG. 3. In the specification and claims, the term "DRAM cell" refers to a memory cell in a general dynamic random access memory (DRAM). A DRAM cell includes, for example, a single capacitor CS and a single transmission transistor TS. The capacitor CS stores transmitted data, and outputs the stored data during a scan operation. Since current leakage occurs in the capacitor CS, the data stored in the capacitor CS may be destroyed if a considerable time has elapsed. Accordingly, the DRAM cells require a refresh operation in which the stored data is amplified and written repeatedly at a regular refresh period in order to prevent the data from being destroyed. The transmission transistor TS is controlled by a word line drive signal WLD externally provided. In other words, the transmission transistor TS is turned on to transmit data of the bit line BL to the capacitor CS in response to activation of the word line drive signal WLD.

Referring again to FIG. 2, the drive control unit 220 receives commands to control the display driver from an external system. The commands include a write/read command WRCMD. The write/read command WRCMD includes a "write command" to command the start of a write operation in which data provided by the external system is written into the memory cells 211 of the memory array 210, and a "read command" to command the start of a read operation in which the data stored in the memory cells 211 is read to the external system. The write and read operations are controlled and performed in a similar way as described below. In the description of the invention, the "write command" and the "read command" are referred to as a "write/read command" for the convenience of description. Also, the write operation and the read operation are referred to as a "write/read operation."

The drive control unit 220 is provided with a clock signal CLK and an oscillation signal OSC. The clock signal CLK is a signal for providing a reference for properly controlling the timing of signals that drive the display driver. The clock signal CLK can be provided externally or generated in an internal circuit of the display driver. The oscillation signal OSC is a signal for oscillating with a certain oscillation period, and is provided by the oscillator 230. The oscillation period of the oscillation signal OSC is used as a reference for a refresh period and a scan period in refreshing and scanning the DRAM cells. The implementation of such an oscillator 230 is apparent to those skilled in the art.

The drive control unit 220 generates a write/read signal WR. Furthermore, the drive control unit 220 generates a scan signal SA activated at a certain scan period, and a refresh signal RF activated at a certain refresh period. In response to the activation of the scan signal SA, a scan operation is performed with respect to a specific word line of the memory array 210. In response to the activation of the refresh signal RF, a refresh operation is performed with respect to a specific word line of the memory array 210. Furthermore, in response to the activation of the write/read signal WR, a write/read operation, in which the data of the external system is written/read to/from specified memory cells 211, is performed.

When the write/read signal WR is activated, the activation of the scan signal SA and the refresh signal RF is blocked. Accordingly, the scan and refresh operations are stopped while the write/read operation is performed.

For example, the scan signal SA is activated in response to a rising edge of the clock signal CLK, and the refresh signal RF is activated in response to a falling edge of the clock signal CLK. Therefore, a collision between the scan and refresh operations in the display driver is prevented.

The word line drive unit 240 receives the scan signal SA, the refresh signal RF and the write/read signal WR, and generates the word line drive signal WLD for activating the word line of the respective memory cells 211. The word line drive signal WLD is activated in response to the activation of one of the scan signal SA, the refresh signal RF and the write/read signal WR, and activates the word line of a specified memory cell 211.

The data input/output unit 250 controls the input/output of the data to/from the memory cells 211 of the memory array 210, and further amplifies the data transmitted to the bit lines BL of the memory cells 211. The data input/output unit 250 forms a transmission path toward the external system during the write/read operation during which the write/read signal WR is activated. Additionally, the data input/output unit 250 forms a transmission path toward the display panel 290 via the latch unit 260, during the scan operation during which the scan signal SA is activated.

Meanwhile, during the refresh operation during which the refresh signal RF is activated, the data input/output unit 250 blocks the transmission paths toward the external system and the display panel 290, and amplifies the data of the bit lines BL and restores the amplified data in the corresponding memory cells 211.

The latch unit 260 latches the data that is transmitted from the data input/output unit 250 to the display panel 290. The driving unit 270 transmits the data latched in the latch unit 260 to the display panel 290 in response to the scan signal SA.

Figure 4:
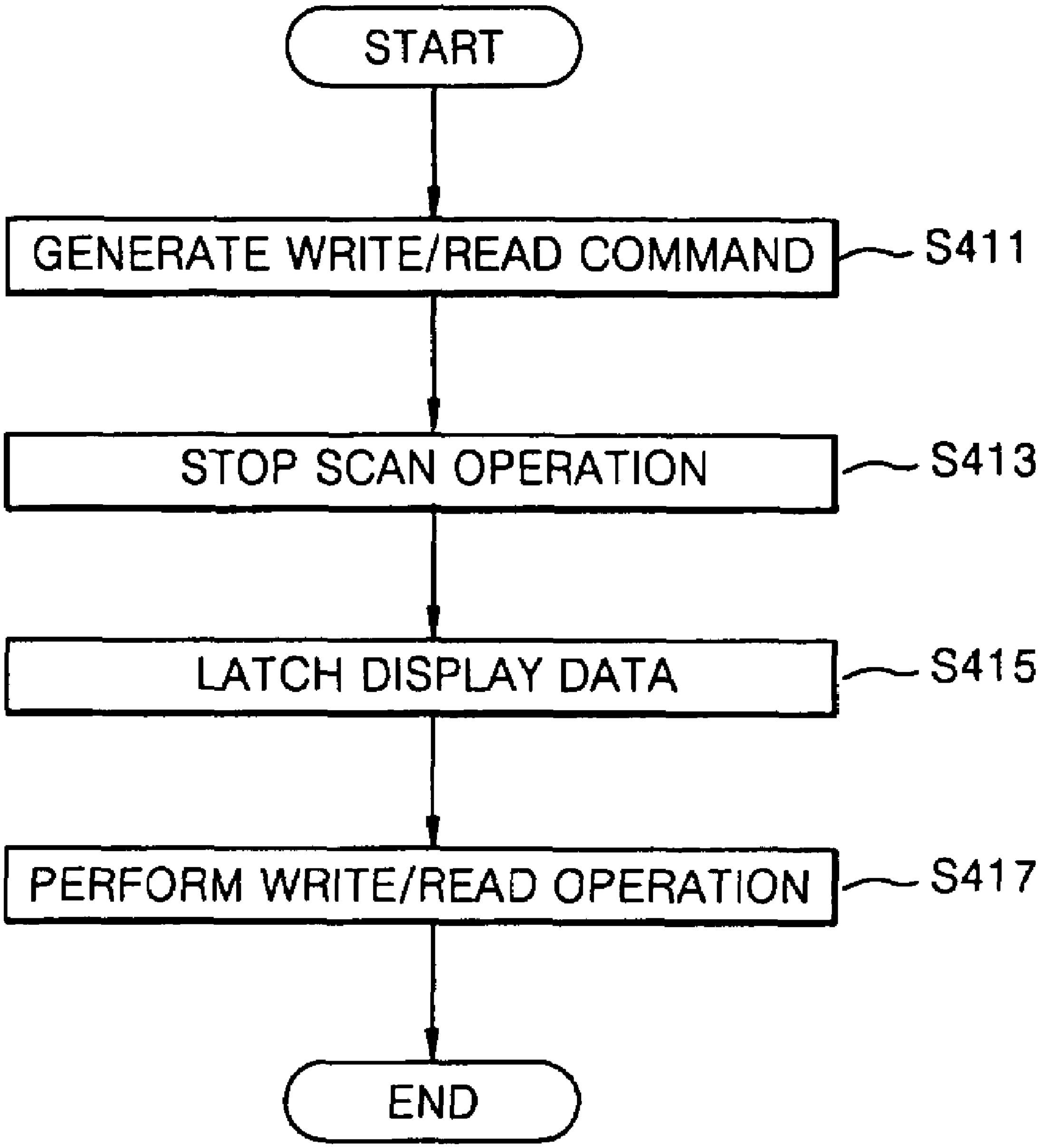
FIG. 4 is a flowchart for describing a method of controlling the display driver in FIG. 2 in case that a write/read command is generated during a scan operation.

FIG. 4 is a flowchart for describing a method of controlling the timing of the display driver in FIG. 2. In this case, the write/read command is generated during the scan operation. Referring to FIG. 4, when a write/read command for the display driver is generated at step S411, a scan operation being performed is stopped at step S413. Thereafter, scanned display data is latched at step S415, and a write/read operation is performed at step S415.

Figure 5:
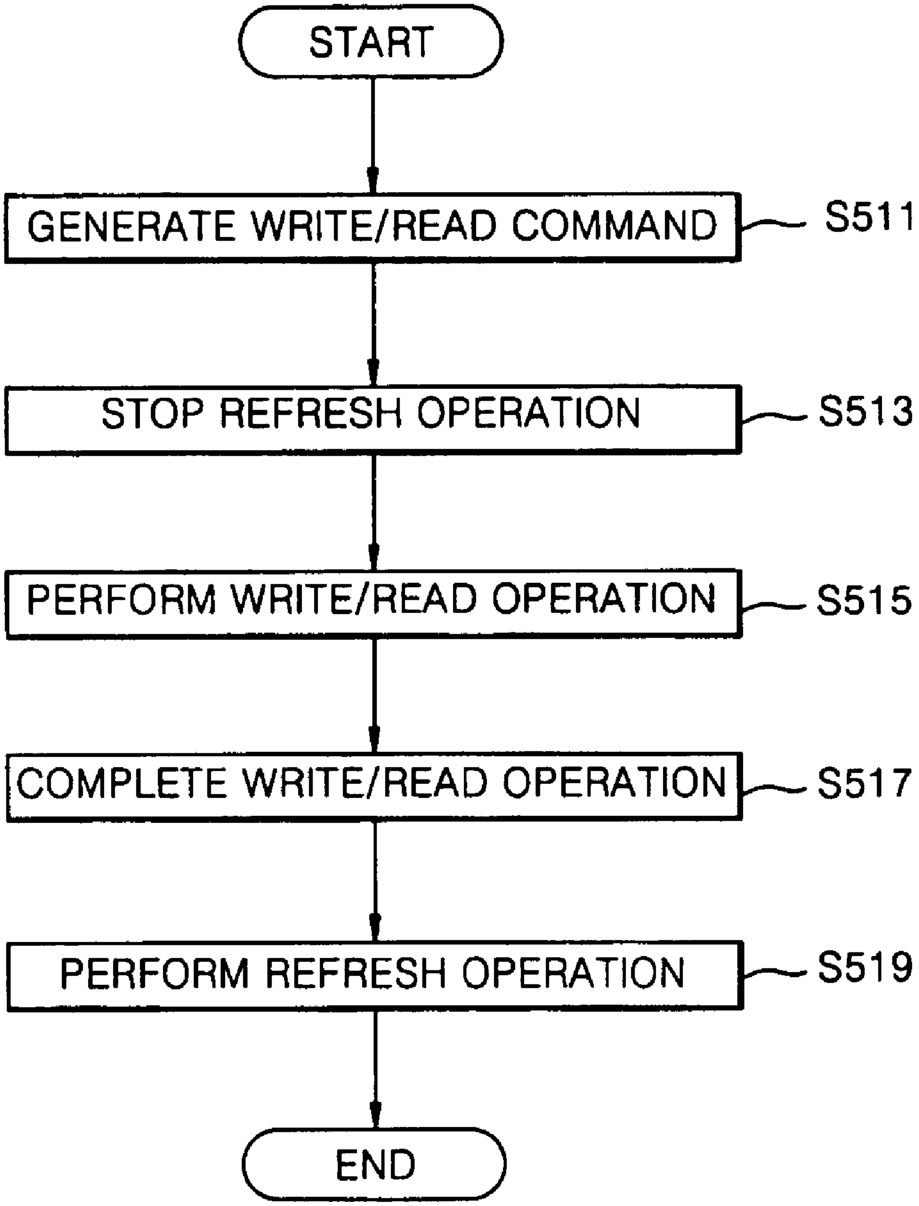
FIG. 5 is a flowchart for describing a method of controlling the display driver in FIG. 2 in case that the write/read command is generated during a refresh operation.

FIG. 5 is a flowchart for describing a method of controlling the timing of the display driver in FIG. 2. In this case, the write/read command is generated during the refresh operation. Referring to FIG. 5, when a write/read command for the display driver of the present invention is generated at step S511, a refresh operation being performed is stopped at step S513. Thereafter, a write/read operation is performed at step S515. Subsequently, when the write/read operation is completed at step S517, the refresh operation is resumed.

In the above embodiments of the display driver of the present invention, a unit memory cell is implemented using a DRAM cell having a single transistor and a single capacitor. Accordingly, a required layout area is considerably reduced.

Also, as described above in the method of controlling the timing of the display driver, the write/read operation has priority over the refresh operation and the scan operation. In other words, the write/read operation is performed first in case that the write/read, refresh and scan operations are simultaneously requested to be performed. Owing to this priority, a collision between the operations is prevented.

Although the present invention has been described with reference to the embodiments shown in the drawings, the embodiments are just examples, and those skilled in the art will appreciate that various modifications and other equivalent embodiments are possible. In the specification, an embodiment in which scan periods and refresh periods are controlled by oscillation signals that have the same oscillation periods generated by an oscillator has been described. However, those skilled in the art will appreciate that the scan periods can be controlled by signals that have demultiplied or multiplied periods with respect to the oscillation signals. Accordingly, the technical scope of the present invention must be determined by the technical spirit of the attached claims.

What is claimed is:

1. A display driver, comprising:

a memory array having memory cells arranged in a matrix form defined by rows and columns, each of the memory cells being a Dynamic Random Access Memory (DRAM) cell in which a refresh operation is performed at a regular refresh period to maintain stored data;

a drive control unit for generating a scan signal, a refresh signal and a write/read signal to control a scan operation in which data of the memory array is scanned and transmitted to a display panel in response to the scan signal, a refresh operation in which the memory array is refreshed in response to the refresh signal, and a write/read operation in which data of an external system is written/read into/from the memory cells in response to the write/read signal, respectively;

a word line drive unit for providing a word line drive signal to the memory array, the word line drive signal activating a word line of corresponding one of the memory cells; and a data input/output unit for controlling input/output of data to/from the memory cells of the memory array, amplifying data of bit lines of the memory cells, forming a transmission path toward the external system during the write/read operation, and forming a transmission path toward the display panel during the scan operations, wherein the scan signal is activated in response to a first direction transition edge of a clock signal, and the refresh signal is activated in response to a second direction transition edge of the clock signal.

2. The display driver as set forth in claim 1, wherein the drive control unit gives priority to the write/read operation so that the scan and refresh operations are stopped when the write/read operation is performed.

3. The display driver as set forth in claim 1, wherein the word line is activated in response to activation of one of the scan signal, the refresh signal and the write/read signal.

4. The display driver as set forth in claim 1, wherein the first direction transition edge of the clock signal is a rising edge of the clock signal, and the second direction transition edge of the clock signal is a falling edge of the clock signal.

5. The display driver as set forth in claim 1, further including a latch unit connected between the data input/output unit and the display panel, the latch unit latching data transmitted from the data input/output unit.

6. The display driver as set forth in claim 1, wherein the transmission path from the data input/output unit to the display panel is formed in response to the scan signal.

7. The display driver as set forth in claim 1, wherein the data of bit lines is amplified in response to the refresh signal.

8. A method of controlling timing of a display driver having memory cells each of which is a DRAM cell, comprising:

performing a scan operation of scanning data in the memory cells and transmitting the scanned data to a display panel; and performing a refresh operation of refreshing the memory cells;

wherein the scan operation is performed in response to a first direction transition edge of a clock signal, and the refresh operation is performed in response to a second direction transition edge of the clock signal.

9. The method as set forth in claim 8, further comprising:

applying a write/read command to write/read input data into/from the memory cells and providing addresses of the memory cells, while the scan operation is performed;

stopping the scan operation in response to the write/read command;

latching data, which is scanned during the scan operation, in response to the write/read command; and writing the input data into the memory cells specified by the addresses in response to the write/read command.

10. The method as set forth in claim 8, further comprising:

applying a write command signal to write data into the memory cells and providing addresses of the memory cells, while the refresh operation is performed;

stopping the refresh operation in response to the write command; and writing the input data into the memory cells specified by the addresses in response to the write command.

11. The method as set forth in any of claim 8, wherein the first direction transition edge of the clock signal is a rising edge of the clock signal, and the second direction transition edge of the clock signal is a falling edge of the clock signal.

12. A method of controlling timing of a display driver including a memory array having memory cells arranged in a matrix form defined by rows and columns, each of the memory cells being a DRAM cell in which a refresh operation is performed at a regular refresh period to maintain stored data, the method comprising:

granting priority to a write/read operation when a scan operation of scanning data from the memory array and transmitting the scanned data to a display panel, a refresh operation of refreshing the memory array, and a write/read operation of writing/reading data into/from the memory cells are simultaneously requested to be performed; and stopping the scan and refresh operations while the write/read operation is performed, wherein the scan operation is performed in response to a first direction transition edge of a clock signal and the refresh operation is performed in response to a second direction transition edge of the clock signal, so that the scan and refresh operations are prevented from being simultaneously performed.

13. The method as set forth in claim 12, wherein the first direction transition edge of the clock signal is a rising edge of the clock signal, and the second direction transition edge of the clock signal is a falling edge of the clock signal.

* * * * *